(12) United States Patent
Cho et al.

(10) Patent No.: US 12,120,852 B2
(45) Date of Patent: Oct. 15, 2024

(54) COMPOSITE MATERIAL AND HEAT DISSIPATION PART

(71) Applicant: THE GOODSYSTEM CORP., Ansan-si (KR)

(72) Inventors: Meoung-whan Cho, Yongin-si (KR); Seog-woo Lee, Hwaseong-si (KR); Young-suk Kim, Suwon-si (KR)

(73) Assignee: THE GOODSYSTEM CORP., Ansan-si (KR)

( * ) Notice: Subject to any disclaimer, the term of this patent is extended or adjusted under 35 U.S.C. 154(b) by 306 days.

(21) Appl. No.: 17/716,162

(22) Filed: Apr. 8, 2022

(65) Prior Publication Data
US 2022/0394882 A1 Dec. 8, 2022

(30) Foreign Application Priority Data
Jun. 8, 2021 (KR) .......................... 10-2021-0074429

(51) Int. Cl.
| | |
|---|---|
| H05K 7/20 | (2006.01) |
| C22C 9/00 | (2006.01) |
| C22C 21/00 | (2006.01) |

(52) U.S. Cl.
CPC ........... H05K 7/20481 (2013.01); C22C 9/00 (2013.01); C22C 21/00 (2013.01)

(58) Field of Classification Search
CPC ...... C22C 9/00; C22C 21/00; H05K 7/20481; H01L 23/42; H01L 23/3736; H01L 23/3732
See application file for complete search history.

(56) References Cited

U.S. PATENT DOCUMENTS

| | | | | |
|---|---|---|---|---|
| 4,287,406 | A * | 9/1981 | Davies ...................... | B01J 8/42 219/71 |
| 5,574,377 | A * | 11/1996 | Marquez-Lucero .. | G01M 3/045 73/40 |
| 5,698,081 | A * | 12/1997 | Lashmore .............. | C25D 17/16 204/240 |
| 2003/0100137 | A1* | 5/2003 | Venkatasubramanian | .................. H10N 10/00 438/64 |

(Continued)

FOREIGN PATENT DOCUMENTS

| | | |
|---|---|---|
| JP | 9-312362 | 12/1997 |
| JP | 2018-111883 | 7/2018 |
| WO | 2016-035796 | 3/2016 |

*Primary Examiner* — Henry T Crenshaw
(74) *Attorney, Agent, or Firm* — LEX IP MEISTER, PLLC

(57) ABSTRACT

A composite material and a heat dissipation part composed of the composite material are provided. More particularly, a composite material comprising a metal matrix and a structure in which thermally conductive particles are dispersed inside the metal matrix is provided, wherein: the metal matrix is composed of Cu, Ag, Al, Mg, or an alloy thereof; the thermally conductive particles include diamond or SiC; the thermally conductive particles are included at a volume ratio of 15% to 80%; in a microstructure of the composite material, the distance between the center of any one thermally conductive particle and the center of a thermally conductive particle most adjacent to the any one thermally conductive particle is 200 μm or greater; and the any one thermally conductive particle and the thermally conductive particle most adjacent thereto are not in contact with each other but have a metal matrix therebetween.

19 Claims, 11 Drawing Sheets

(56) References Cited

U.S. PATENT DOCUMENTS

2018/0328677 A1* 11/2018 Kim .................... H01L 23/3735
2019/0246491 A1* 8/2019 Zinn .................... H05K 3/4053

* cited by examiner

[FIG.1]
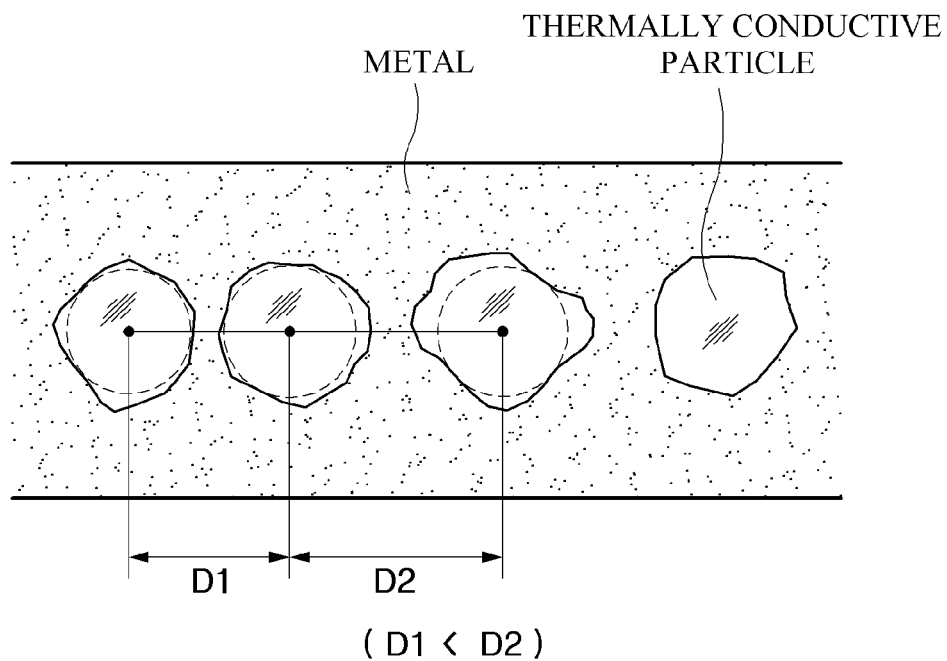
(D1 < D2)
[FIG.2]
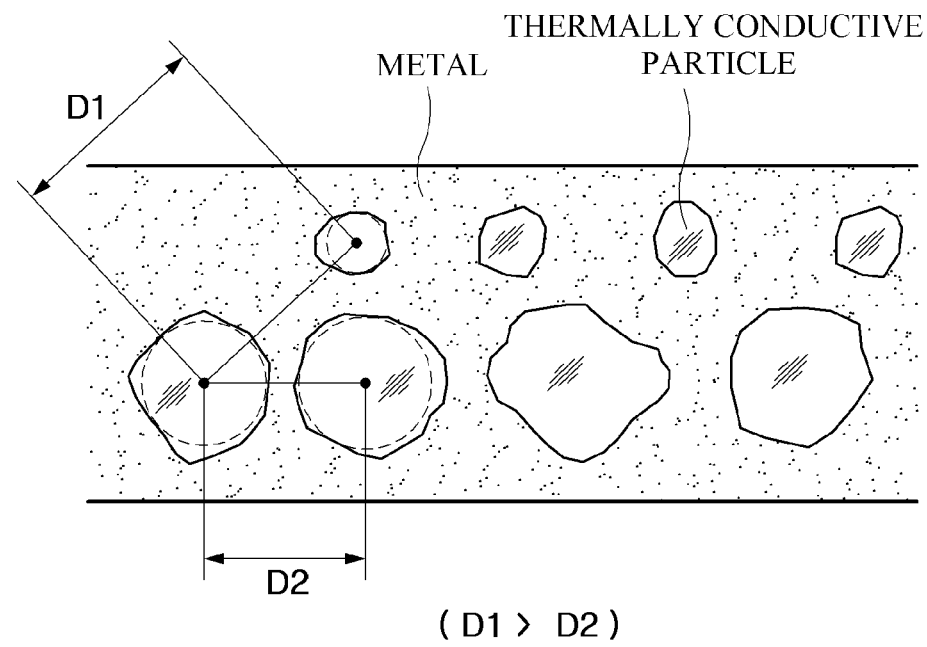
(D1 > D2)

[FIG.3]
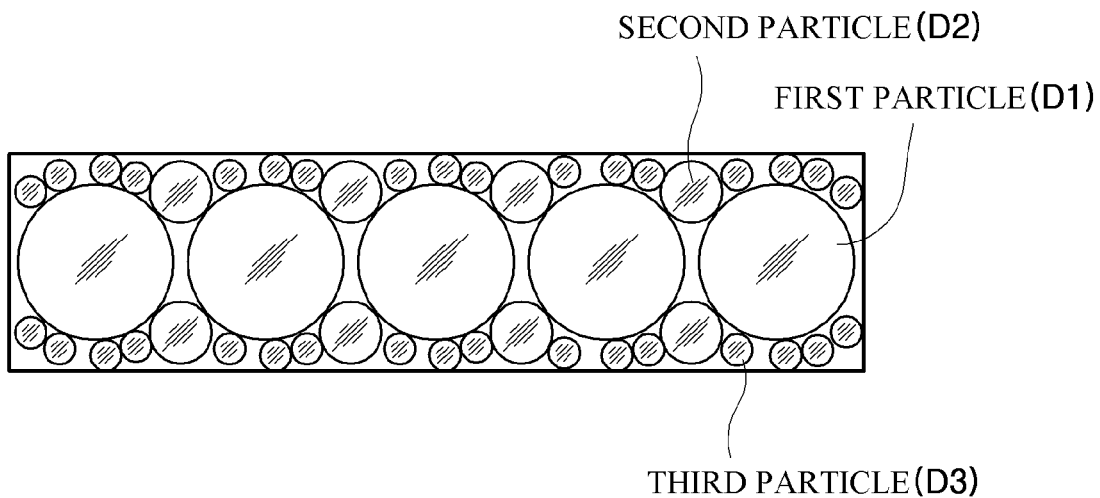
[FIG.4]
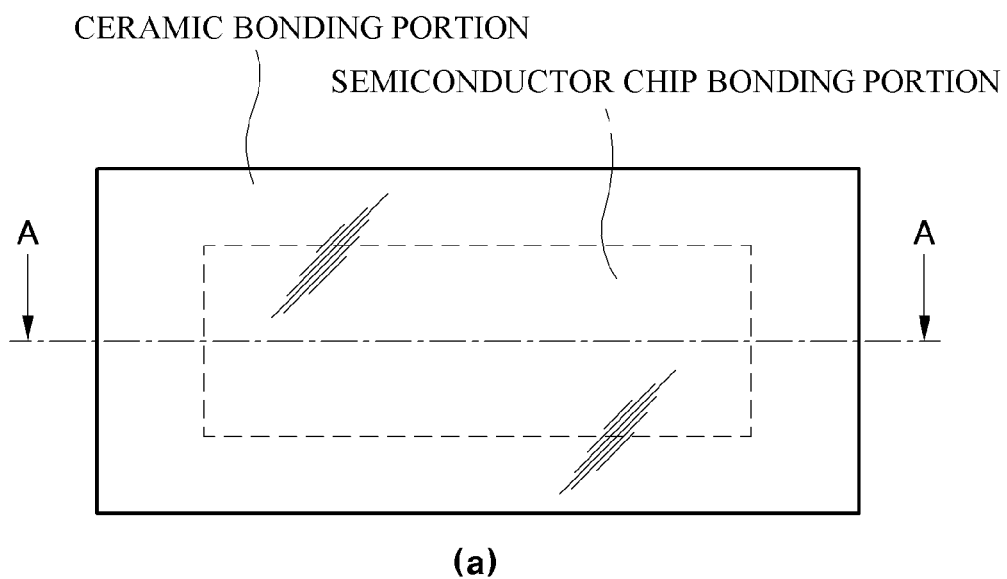
(a)
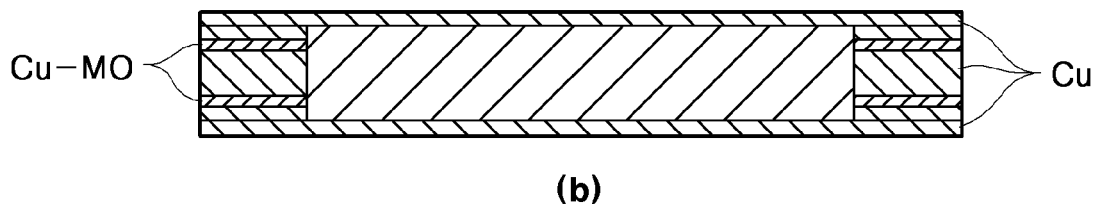
(b)

[FIG.5]
CERAMIC BONDING PORTION
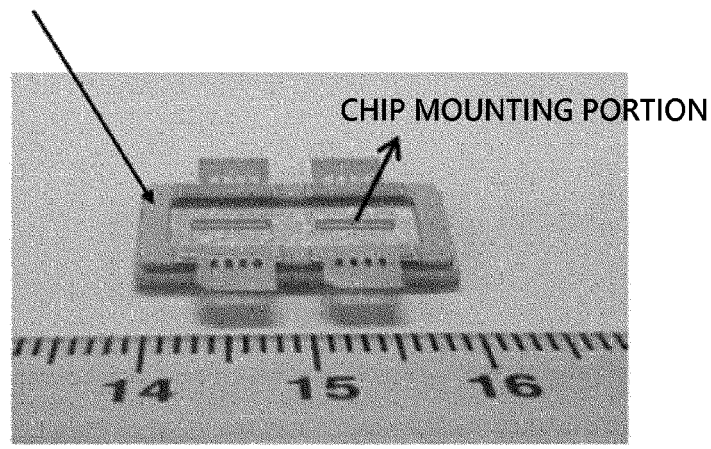
CHIP MOUNTING PORTION
[FIG.6]
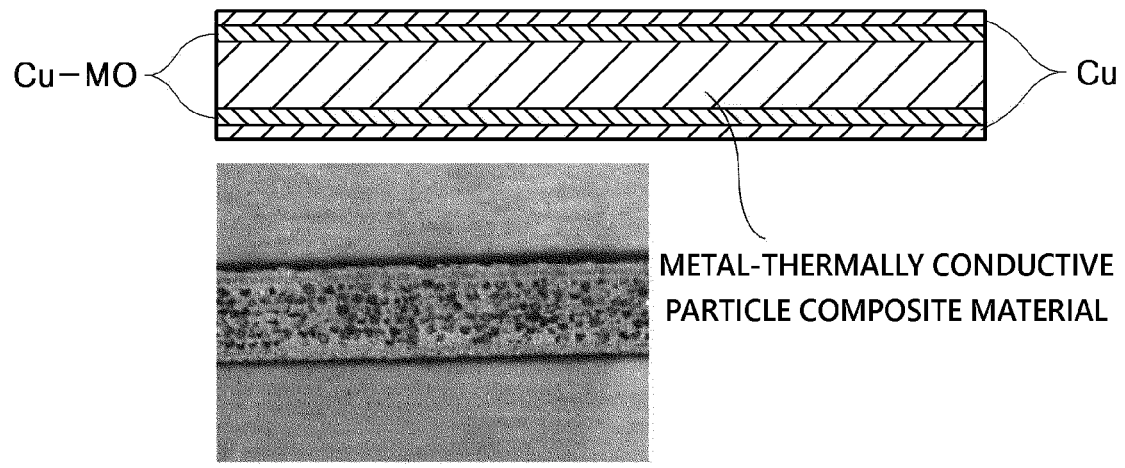
Cu-MO
Cu
METAL-THERMALLY CONDUCTIVE
PARTICLE COMPOSITE MATERIAL

[FIG.7]
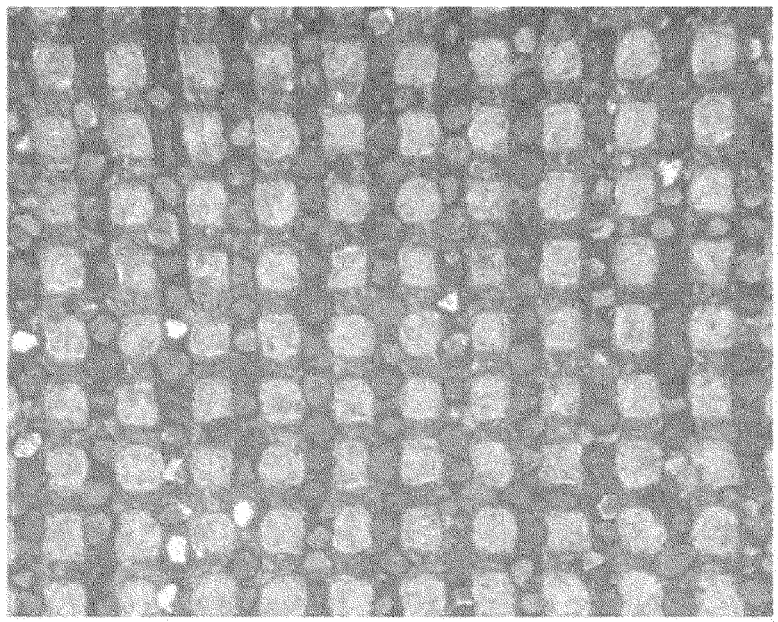
[FIG.8]
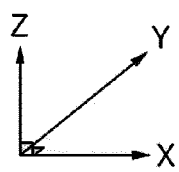
(EXAMPLE 1-1)
DIAMOND 17.5%
(D1=about 700μm)
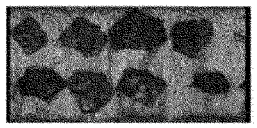
(EXAMPLE 1-2)
DIAMOND 35%
(D1=about 700μm)
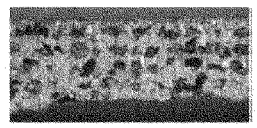
(EXAMPLE 1-3)
DIAMOND 40%
(D1=about 200μm)
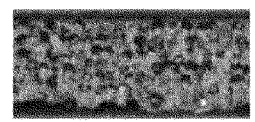
(COMPARATIVE EXAMPLE 1)
DIAMOND 40%
(D1=about 150μm)

[FIG.9]
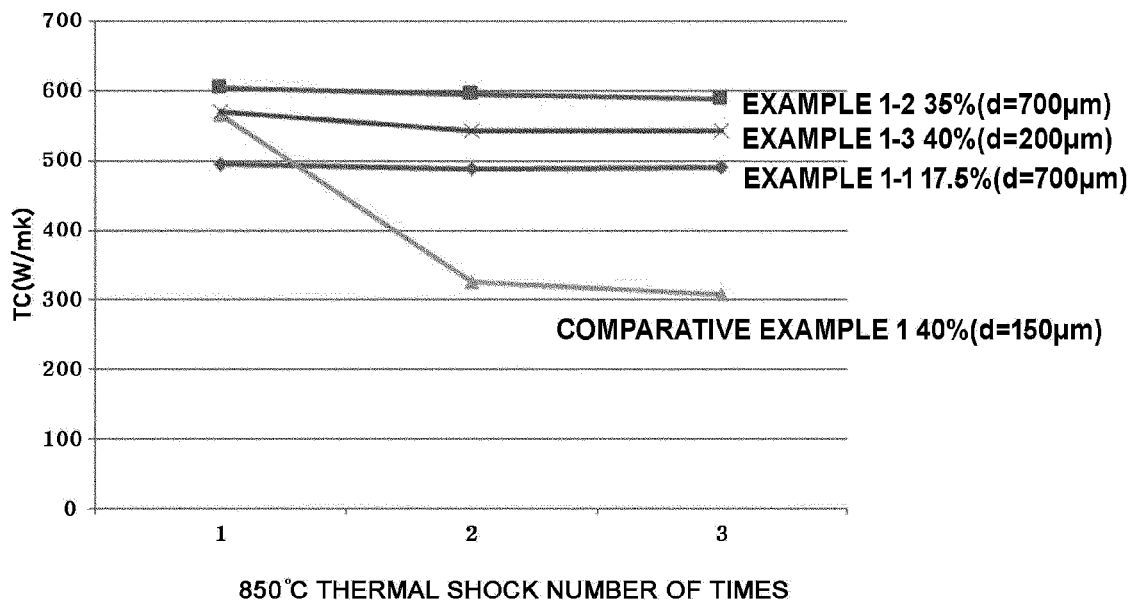
[FIG.10]
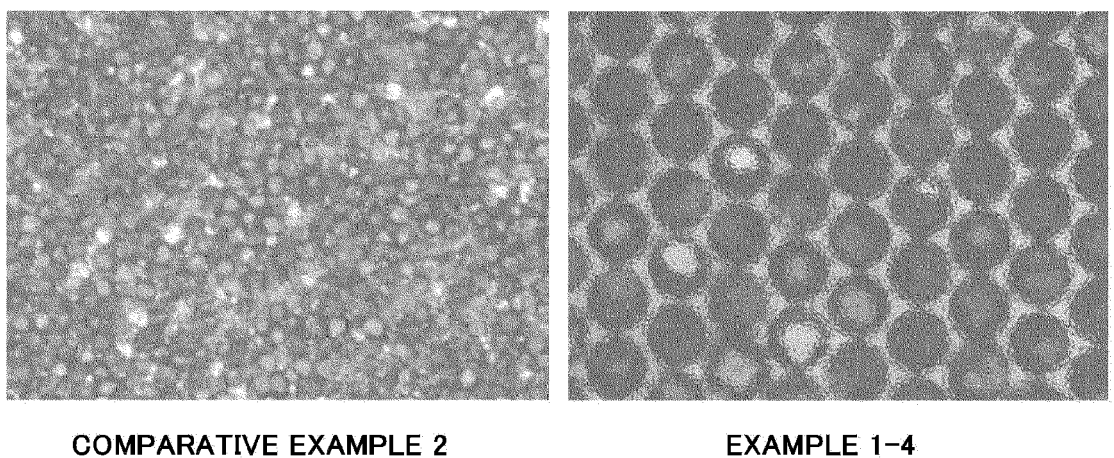
COMPARATIVE EXAMPLE 2    EXAMPLE 1-4

[FIG.11]
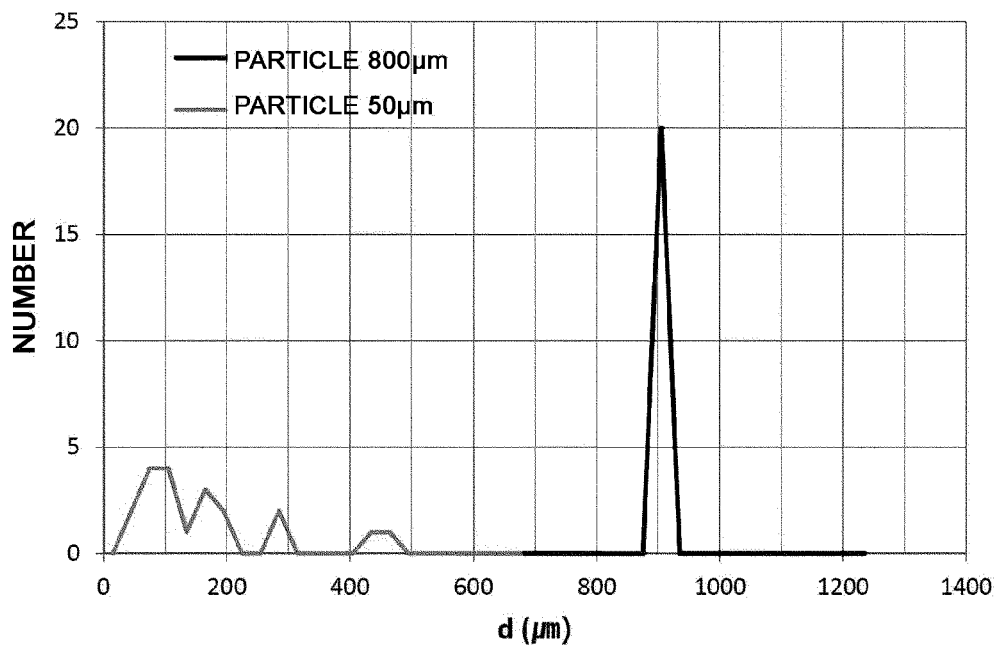
[FIG.12]
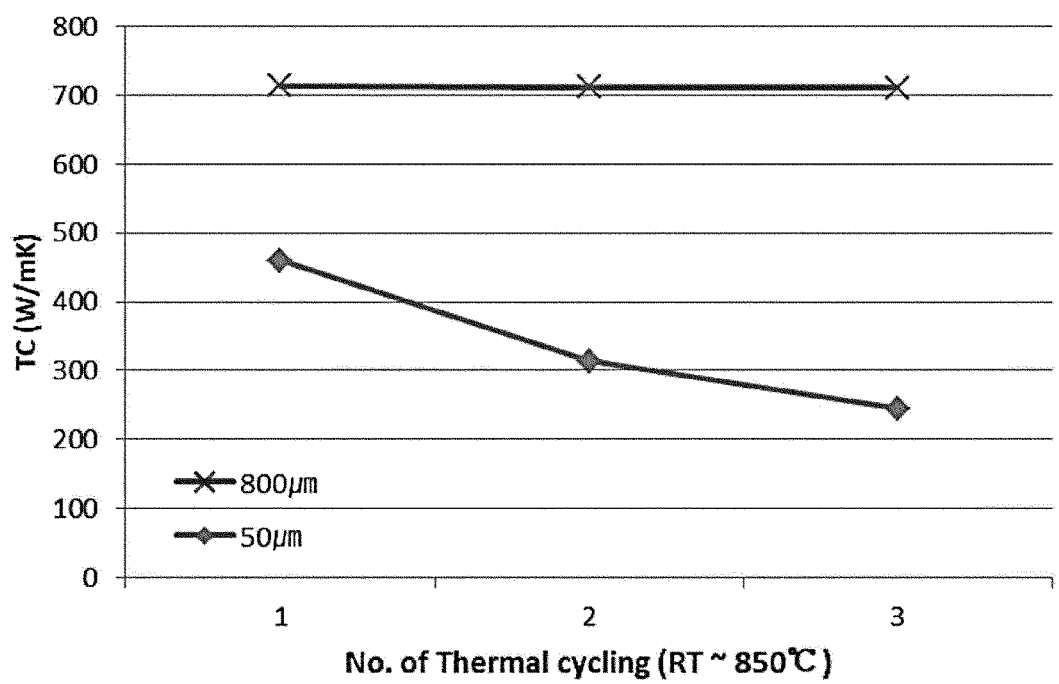

[FIG.13]
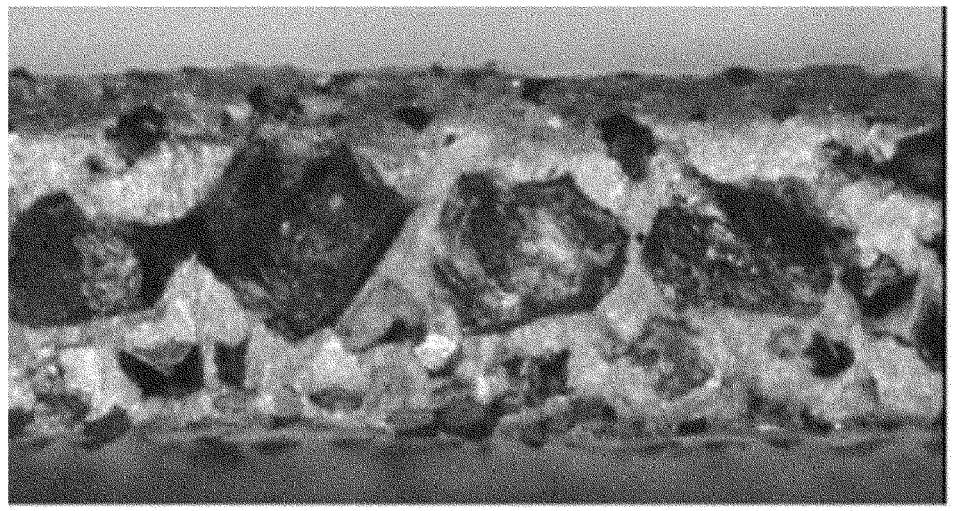

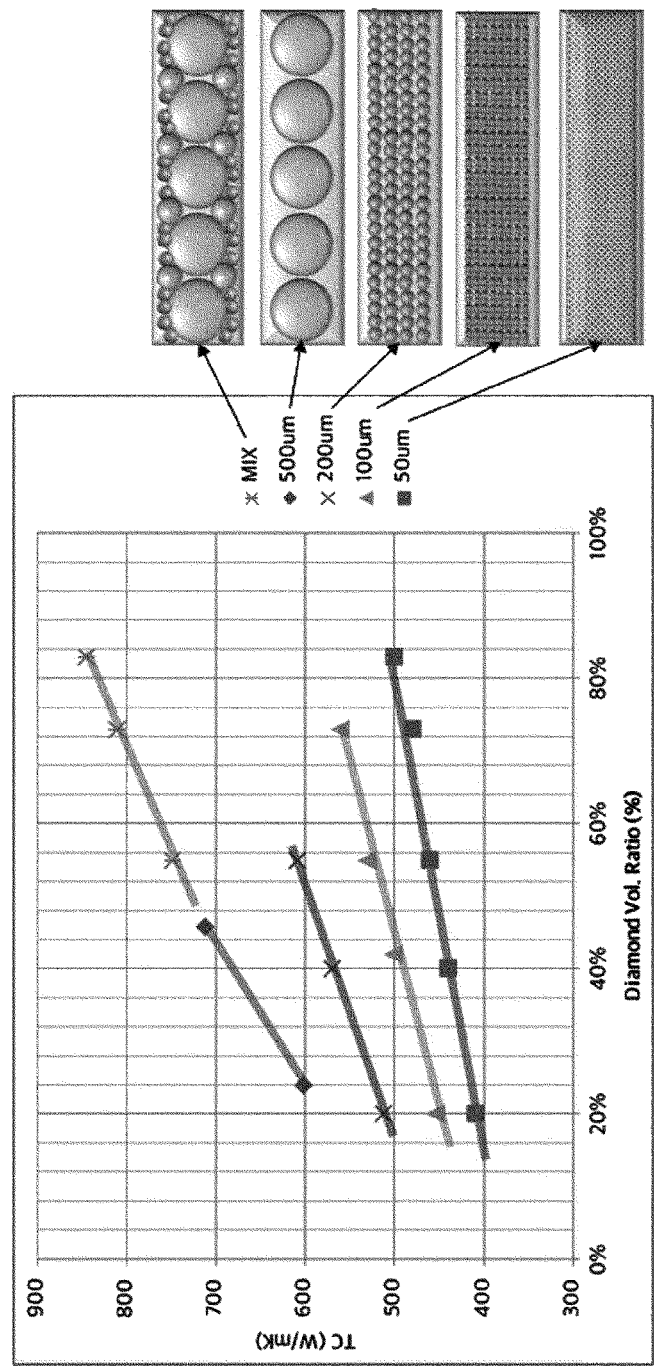
[FIG.14]

[FIG.15]
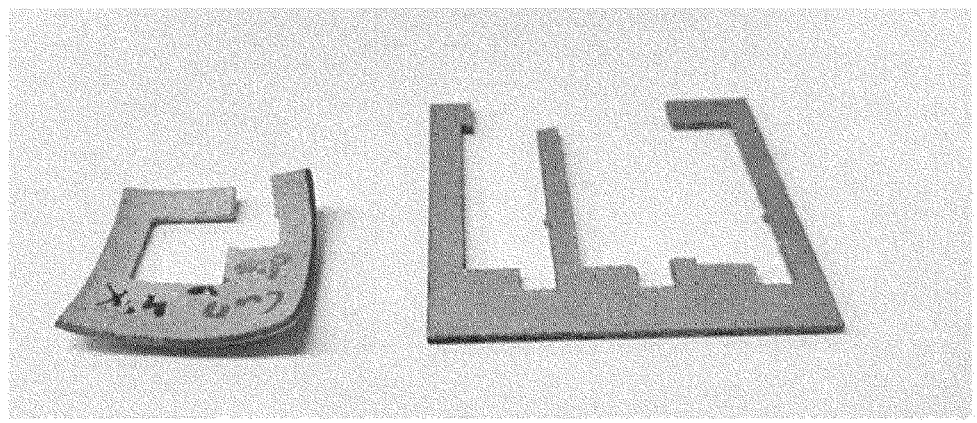
NORMAL POWER SINTERED UNIFORM DISPERSION TECHNIQUE APPLIED
[FIG.16]
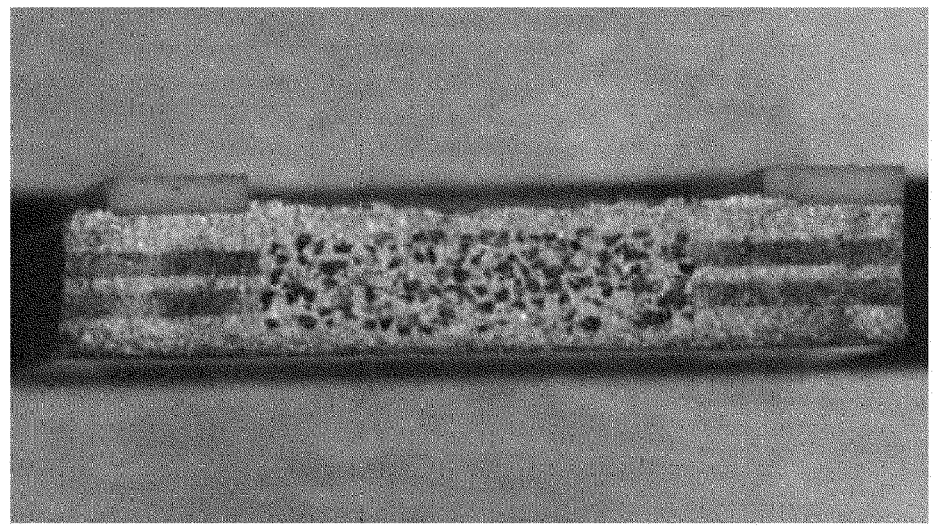

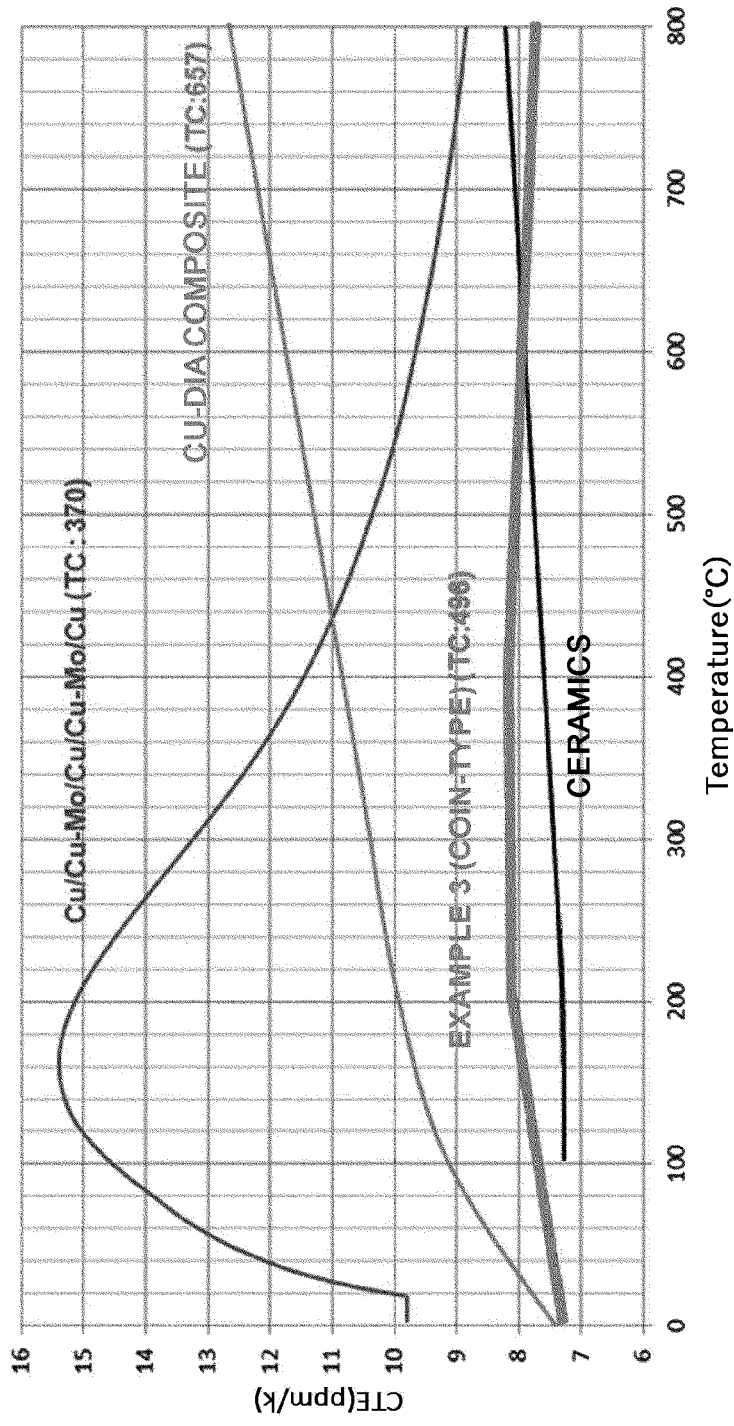
[FIG. 17]

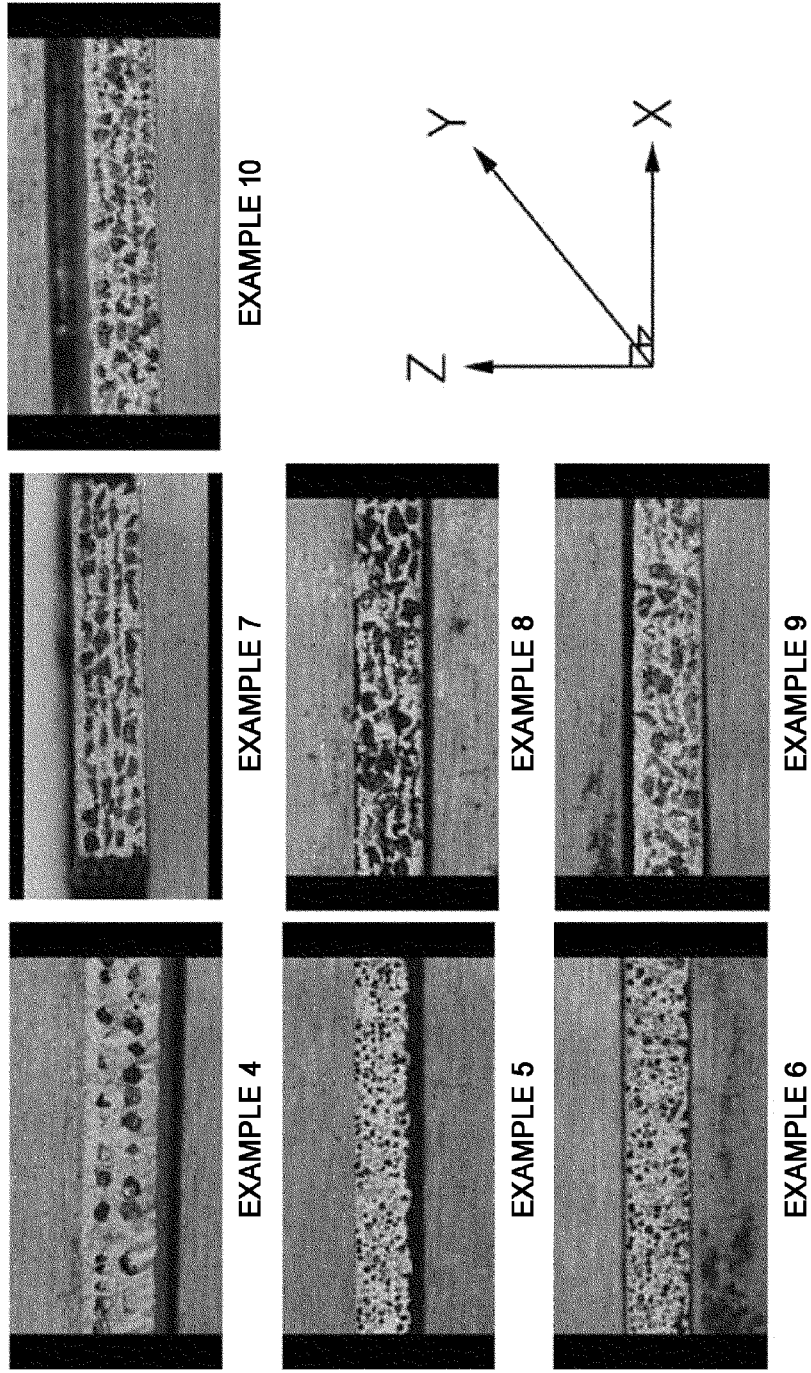

COMPOSITE MATERIAL AND HEAT DISSIPATION PART

BACKGROUND OF THE INVENTION

1. Field of the Invention

The present invention relates to a composite material of a metal and a non-metal and a heat dissipation part composed of the composite material. More specifically, the present invention relates to a composite material in which particles composed of a material having excellent thermal conductivity properties, such as diamond or silicon carbide (SiC), are uniformly dispersed in a metal matrix, and more particularly, to a composite material capable of preventing the degradation in thermal conductivity even if a thermal cycle caused by heating and cooling is repeatedly applied.

2. Description of the Related Art

As the output of an electronic device increases, the amount of heat generated during the operation of a semiconductor device included in the electronic device tends to gradually increase. Accordingly, a heat dissipation part is installed in the semiconductor device to release heat generated in the semiconductor device to the outside. The heat dissipation part is required to have high thermal conductivity and a small difference in thermal expansion coefficient with the semiconductor device.

In order to increase thermal conductivity and maintain a low thermal expansion coefficient with the semiconductor device, a heat dissipation part made of a composite material in which particles having excellent thermal conductivity such as diamond or silicon carbide (SiC) are dispersed and composited in a metal matrix such as copper (Cu), silver (Ag), aluminum (Al), or magnesium (Mg) is widely used. As the composite materials, various combinations such as a Cu-diamond composite material, a Ag-diamond composite material, a Al-diamond composite material, a Mg—SiC composite material, a Al—SiC composite material, and the like are known.

Meanwhile, thermal conductivity and a thermal expansion coefficient required for a heat dissipation part vary depending on a product to which the heat dissipation part is applied, so that it is necessary to adjust the combination of a metal and thermally-conductive particles constituting the composite material or the volume ratio of the thermally-conductive particles.

However, when the composite material is heated to a high temperature, the thermal conductivity thereof deteriorates compared to the thermal conductivity thereof before the heating, so that there is a problem that thermal conductivity is not implemented as originally designed in an actual use.

In this regard, the following patent document discloses a method for suppressing the deterioration in thermal conductivity to be within 5% or less after heating to 800° C. by reducing and densifying the amount of oxygen contained in a composite material. However, even if the technique of Patent Document 1 is applied, rapid deterioration in thermal conductivity may occur if a thermal cycle is repeated two or three times or more.

PRIOR ART DOCUMENT

Patent Document (Patent Document 1) Japanese Patent Laid-Open Publication No. 2018-111883

SUMMARY OF THE INVENTION

The invention provides a composite material having excellent thermal conductivity and a controlled thermal expansion coefficient required for a semiconductor device, without the deterioration in thermal conductivity even if a thermal cycle is applied.

The invention also provides a heat dissipation part using the above composite material.

According to an embodiment of the invention, there is provided a composite material having a metal matrix and a structure in which thermally conductive particles are dispersed inside the metal matrix, wherein the metal matrix is composed of Cu, Ag, Al, Mg, or an alloy thereof, the thermally conductive particles include diamond or SiC, the thermally conductive particles are included at a volume ratio of 15% to 80%, and in a microstructure of the composite material, the distance between the center of any one thermally conductive particle and the center of a thermally conductive particle most adjacent to the any one thermally conductive particle is 200 μm or greater, and the thermal conductivity measured after heating the composite material to a temperature lower by 20 to 30% than the melting point of the metal matrix has a thermal conductivity degradation rate of 5% or less based on the thermal conductivity thereof before the heating.

According to another embodiment of the invention, there is provided a composite material having a metal matrix and a structure in which thermally conductive particles are dispersed inside the metal matrix, wherein the metal matrix is composed of Cu, Ag, Al, Mg, or an alloy thereof, the thermally conductive particles include diamond or SiC, the thermally conductive particles are included at a volume ratio of 15% to 80%, and in a microstructure of the composite material, the thermally conductive particles include a large particle and a small particle with a particle size difference of 150 μm or greater, wherein when the large particle is a first particle, and a particle relatively smaller than that is a second particle, the distance between the center of the first particle and the center of a first particle most adjacent to the first particle or the second particle is 200 μm or greater, and the thermal conductivity measured after heating the composite material to a temperature lower by 20 to 30% than the melting point of the metal matrix has a thermal conductivity degradation rate of 5% or less based on the thermal conductivity thereof before the heating.

According to another embodiment of the invention, there is provided a heat dissipation part composed of the composite material according to the one embodiment or the another embodiment of the invention.

Advantageous Effects

A composite material according to the invention may implement a thermal expansion coefficient suitable for a purpose of use, such as a semiconductor device, together with various thermal conductivity, and particularly, may suppress the degradation in thermal conductivity even if a thermal cycle caused by heating and cooling is repeatedly applied, thereby providing highly reliable heat dissipation properties.

BRIEF DESCRIPTION OF THE DRAWINGS

FIG. 1 schematically shows a process of obtaining the distance between the center of any one thermally conductive particle and the center of a thermally conductive particle most adjacent to the any one thermally conductive particle on a cross-section of a composite material according to a first embodiment of the invention;

FIG. 2 schematically shows a process of obtaining the distance between the center of a first particle and the center of a first particle most adjacent to the first particle or a second particle on a cross-section of a composite material according to a second embodiment of the invention;

FIG. 3 is a schematic view for describing a cross-sectional structure in a thickness direction of a plate-shaped composite material according to a second embodiment of the invention;

FIG. 4 is a plan view and a cross-sectional view of a composite material according to a third embodiment of the invention;

FIG. 5 shows a ceramic bonding portion and a chip mounting portion in a heat dissipation part composed of a composite material according to the third embodiment of the invention;

FIG. 6 is a cross-sectional structure of a composite material according to a fourth embodiment of the invention, and a microscopic photograph of a cross-section of a plate composed of a composite material manufactured according to the structure;

FIG. 7 is a microscopic photograph of a plane of a composite material plate according to a fifth embodiment of the invention;

FIG. 8 shows cross-sectional structures of three examples (Examples 1-1 to 1-3) which belong to the scope of the embodiment of the invention, and the cross-sectional structure of one example (Comparative Example 1) which do not belong to the scope of the embodiment thereof;

FIG. 9 shows the comparison of thermal conductivity before heating and thermal conductivity after the heating after applying a thermal cycle of heating composite materials manufactured according to Examples 1-1 to 1-3 and Comparative Example 1 to 850° C.;

FIG. 10 is images of composite materials manufactured according to Example 1-4 and Comparative Example 2 observed on a planar cross-section;

FIG. 11 shows the results of measuring the distribution of distances between the centers of diamond particles observed on planar cross-sections of the composite materials manufactured according to Examples 1~4 and Comparative Example 2;

FIG. 12 shows the comparison of thermal conductivity before heating and thermal conductivity after the heating after applying heat of heating the composite materials manufactured according to Examples to 1-3 and Comparative Example 1 to 850° C.;

FIG. 13 is a cross-sectional photograph in a thickness direction of a composite material plate manufactured according to Example 2 of the invention;

FIG. 14 is a graph showing the difference in thermal conductivity according to a diamond volume ratio between regularly arranging diamond particles of the same size and arranging diamond particles in an inclined structure according to Example 2;

FIG. 15 shows the comparison of bending states after heating of a composite material plate in which diamond particles manufactured according to Example 2 of the invention are symmetrically arranged based on the center of thickness and heating a composite material plate in which diamond particles are randomly dispersed;

FIG. 16 is a cross-sectional image of a laminated plate having a structure in which a copper-diamond composite material is buried inside a Cu/Cu—Mo/Cu/Cu—Mo/Cu laminated plate manufactured according to Example 3 of the invention;

FIG. 17 shows the results of measuring thermal expansion coefficients of the laminated plate in which a copper-diamond composite material is buried and which is manufactured according to Example 3 of the invention, the Cu/Cu—Mo/Cu/Cu—Mo/Cu laminated plate, and the copper-diamond composite material according to temperatures; and FIG. 18 is cross-sectional images of composite material plates manufactured according to Examples 4 to 4 of the invention.

DETAILED DESCRIPTION OF THE EXEMPLARY EMBODIMENTS

Hereinafter, the configurations and operations of embodiments of the present invention will be described with reference to the accompanying drawings. In the following description of the present invention, when it is determined that detailed descriptions of related known functions or configurations may unnecessarily obscure the gist of the present invention, the detailed descriptions will be omitted. In addition, when a portion is said to 'include' any component, it means that the portion may further include other components rather than excluding the other components unless otherwise stated.

First Embodiment

A composite material according to the first embodiment of the invention has a metal matrix and a structure in which thermally conductive particles are uniformly dispersed inside the metal matrix, wherein the metal matrix is composed of Cu, Ag, Al, Mg, or an alloy thereof, the thermally conductive particles include diamond or SiC, the thermally conductive particles are included at a volume ratio of 15% to 80%, and in a microstructure of the composite material, the distance between the center of any one thermally conductive particle and the center of a thermally conductive particle most adjacent to the any one thermally conductive particle is 200 μm or greater, and the thermal conductivity measured after heating the composite material to a temperature lower by 20 to 30% than the melting point of the metal matrix has a thermal conductivity degradation rate of 5% or less based on the thermal conductivity thereof before the heating.

The 'alloy thereof' means a Cu alloy, a Ag alloy, a Al alloy, and a Mg alloy, and each alloy may include Cu, Ag, Al, or Mg, which is a main element, in an amount of 80 wt % or greater, preferably 90 wt % or greater, more preferably 95 wt % or greater, and may include all known elements which may be alloyed with the main element as an alloying element, and may preferably include an element capable of minimizing the degradation in thermal conductivity.

When the thermally conductive particles are included at a volume ratio of less than 15%, thermal conductivity is lowered and a thermal expansion coefficient is difficult to be matched, and when included at a volume ratio of greater than 80%, thermal conductivity is excellent, but thermally conductive particles are not easily bonded and a thermal expansion coefficient is too low, which is not preferable. In terms of productivity and properties, the volume ratio of the thermally conductive particles is preferably 15 to 60%, and most preferably 30 to 50%.

In the present invention, when the particle has a circular shape, the 'center of the thermally conductive particle' means the center of the circular shape, and when the particle has an irregular cross-sectional shape, it means the center of an inscribed circle having the maximum diameter which may be drawn inside the particle. In addition, when a composite material has an arbitrary shape instead of a plate shape, the 'cross-section' is an arbitrary cross-section, and when a composite material has a plate shape, it is a cross-section in a direction parallel to the plane or a cross-section parallel to the thickness.

In addition, the 'thermal conductivity degradation rate' is calculated by [Equation 1] below.

Thermal conductivity degradation rate (%)=(thermal conductivity before heating−thermal conductivity after heating)/(thermal conductivity before heating)×100    [Equation 1]

As illustrated in FIG. 1, when the volume fraction of the thermally conductive particles is 15% or greater and at the same time, a distance D1 between the center of any one thermally conductive particle and the center of a thermally conductive particle most adjacent to the any one thermally conductive particle is maintained to be 200 μm or greater, the thermal conductivity measured after heating the composite material to a temperature lower by 20 to 30% than the melting point of the metal matrix may be maintained to have a thermal conductivity degradation rate of 5% or less based on the thermal conductivity thereof before the heating. Accordingly, it is possible to prevent the thermal conductivity from being rapidly degraded by a thermal cycle applied during a manufacturing process of a heat dissipation part composed of the composite material according to the invention, a mounting process of the heat dissipation part, or the use of the heat dissipation part.

The distance D1 between the center of any one thermally conductive particle and the center of a thermally conductive particle most adjacent to the any one thermally conductive particle is preferably 300 μm or greater, more preferably 400 μm or greater, and most preferably 500 μm or greater. That is, as the distance between the centers of particles increase, the resistance to degradation in thermal conductivity for a thermal cycle increases, but when the distance between thermally conductive particles is increased, thermal conductivity required for a semiconductor device and the like may not be implement, so that the volume fraction of the thermally conductive particles is required be 15% or greater.

In addition, the thermal conductivity measured after repeating 3 times of heating the composite material according to the invention to a temperature lower by 20 to 30% than the melting point of the metal matrix and cooling the composite material to room temperature may have a thermal conductivity degradation rate of 5% or less based on the thermal conductivity thereof before the initial heating.

The thermal conductivity of a composite material used in a typical heat dissipation part is not often degraded after one thermal cycle, but the thermal conductivity thereof is rapidly degraded (particularly, in the case of a copper-diamond composite material). However, the composite material according to the invention may be prevented from the above phenomenon, and thus, may significantly improve the reliability of a heat dissipation part.

When considering the improvement in thermal conductivity and the increase in resistance to degradation in thermal conductivity for a thermal cycle, the size of the thermally conductive particle is preferably 300 μm or greater, more preferably 400 μm or greater, and most preferably 500 μm or greater.

In addition, the composite material may have a plate shape, the particle size of the thermally conductive particle may be 300 μm or greater, and when viewed from a plane of the plate, the distance between the center of any one thermally conductive particle and the center of a thermally conductive particle most adjacent to the any one thermally conductive particle may have a value within ±20% of the median value of distances between the center of all thermally conductive particles observed on the plane of the plate and the center of thermally conductive particles most adjacent thereto. When diamond particles of the above size are disposed in a single layer, and when viewed from the plane of the plate, if the diamond particles are disposed in the above structure, the resistance to deterioration in thermal conductivity may be improved even if the thermal cycle is repeatedly applied.

Second Embodiment

A composite material according to the second embodiment of the invention has a metal matrix and a structure in which thermally conductive particles are dispersed inside the metal matrix, wherein the metal matrix is composed of Cu, Ag, Al, Mg, or an alloy thereof, the thermally conductive particles include diamond or SiC, the thermally conductive particles are included at a volume ratio of 15% to 80%, and in a microstructure of the composite material, the thermally conductive particles include a large particle and a small particle with a particle size difference of 150 μm or greater, wherein when the large particle is a first particle, and a particle relatively smaller than that is a second particle, the distance between the center of the first particle and the center of a first particle most adjacent to the first particle or the second particle is 200 μm or greater, and the thermal conductivity measured after heating the composite material to a temperature lower by 20 to 30% than the melting point of the metal matrix has a thermal conductivity degradation rate of 5% or less based on the thermal conductivity thereof before the heating.

In addition, the thermally conductive particles in various sizes may be mixed and used, and when considering the improvement in thermal conductivity and the increase in resistance to degradation in thermal conductivity for a thermal cycle, the size of the first particle is preferably 300 μm or greater, more preferably 400 μm or greater, and most preferably 500 μm or greater. In addition, the volume fraction occupied by of the first particle in the total thermally conductive particles is preferably 30% or greater, more preferably 40% or greater, and most preferably 50% or greater.

In addition, the second particle may be composed of particles having one particle size distribution, or a mixture of particles having different average particle sizes. Accordingly, the size distribution of thermally conductive particles included in the composite material of the second embodiment may form a bimodal distribution or a multimodal distribution.

When a distance D1 between the center of the first particle and the center of a first particle most adjacent to the first particle or the second particle illustrated in FIG. 2 is not 200 μm or greater, the degradation in thermal conductivity according to a thermal cycle may not be maintained to be 5% or less, so that it is preferable to maintain the above range.

The distance D1 between the center of the first particle and the center of a first particle most adjacent to the first particle or the second particle is preferably 250 μm or greater, and more preferably 300 μm or greater.

In the second embodiment of the invention, the composite material may have a plate shape, and may have a shape in which on a cross-section in a thickness direction, the first particle is disposed in a central region of the thickness of the plate, and the second particle is disposed close to a surface region of the plate, such that the size of the thermally conductive particle decreases from the central region of the thickness toward the surface region.

In the invention, when the composite material is made in a plate shape, the 'thickness direction' means a direction parallel to the thickness of the plate, and the 'plane direction' means a direction parallel to the plane of the plate.

At this time, the first particle may have a shape of being arranged at predetermined intervals along a direction vertical to the thickness in a central region of the thickness of the plate.

As illustrated in FIG. 3, when a first particle D1 having the largest size is arranged in layers in the horizontal direction in the drawing along the center of a cross-section in the thickness direction, and a second particle D2 is arranged around the layers of the first particle D1, and a third particle D3 having the smallest particle size is disposed closest to the surface forming a symmetrical structure, it is possible to increase the volume fraction of the thermally conductive particles in the metal matrix, so that it is advantageous in improving thermal conductivity.

Furthermore, compared to a case in which the thermally conductive particles are randomly arranged, or a case in which particles with a difference of 150 μm or greater in size are regularly arranged at regular intervals but do not form the above symmetrical structure, the above symmetrical structure may achieve effects of improving thermal conductivity in the thickness direction of the plate shape, preventing bending of the plate, and the like.

Meanwhile, what is described in the first embodiment, but not described in the second embodiment should be interpreted the same as in the first embodiment, and are the same in the following embodiments.

Third Embodiment

A composite material according to the third embodiment of the invention is in which the metal matrix of the composite material according to the first embodiment or the second embodiment is composed of Cu or a Cu alloy, and the composite material is buried inside a laminated plate, wherein the laminated plate includes a first layer composed of copper (Cu) or a copper (Cu) alloy, a second layer formed on the first layer and composed of an alloy including copper (Cu) and molybdenum (Mo), a third layer formed on the second layer and composed of copper (Cu) or a copper (Cu) alloy, a fourth layer formed on the third layer and composed of an alloy including copper (Cu) and molybdenum (Mo), and a fifth layer formed on the fourth layer and composed of copper (Cu) or copper (Cu) alloy.

The first layer, the third layer, and the fifth layer may be composed of a copper (Cu) alloy including pure copper (Cu) in an amount of 99.9 wt % or greater and various alloying elements in an amount of 0.1 wt % or greater, and when considering heat dissipation properties, the copper (Cu) alloy may include copper (Cu) in an amount of 80 wt % or greater, preferably 90 wt % or greater, and more preferably 95 wt % or greater.

The second layer and the fourth layer are composed of an alloy including copper (Cu) and molybdenum (Mo), and it is preferable that the alloy includes copper (Cu) in an amount of 5 to 40 wt % and molybdenum (Mo) in an amount of 60 to 95 wt % because if the content of copper (Cu) is less than 5 wt %, it is difficult to maintain good bonding force with a copper (Cu) layer, and the thermal conductivity in the thickness direction is reduced, and if greater than 40 wt %, it is difficult to maintain the thermal expansion coefficient in the plane direction low.

When the thickness of each of the first layer, the third layer, and the fifth layer is maintained in the range of 10 to 1000 μm, the thermal expansion coefficient in the plane direction of a heat dissipation plate may be maintained in the range of 7 to 12×10⁻⁶/K, which is similar to that of a ceramic material, and the thermal conductivity in the thickness direction thereof may be implemented to be 300 W/mK or greater, so that it is preferable to maintain the above range. When the thickness of each of the second layer and the fourth layer is less than 10 μm, it is difficult to maintain the thermal expansion coefficient in the plane direction in the range of 7 to 12×10⁻⁶/K, and when greater than 60 μm, it is difficult to maintain the thermal conductivity in the thickness direction in the range of 300 W/mK or greater, so that it is preferable to maintain the thickness in the range of 10 to 60 μm. When the thickness of each of the second layer and the fourth layer is less than 10 μm, it is difficult to maintain the thermal expansion coefficient in the plane direction in the range of 7 to 12×10⁻⁶/K, and when greater than 60 μm, it is difficult to maintain the thermal conductivity in the thickness direction in the range of 300 W/mK or greater, so that it is preferable to maintain the thickness in the range of 10 to 60 μm.

As illustrated in FIG. 4, the composite material according to the third embodiment has a structure in which a composite material (a portion hatched with oblique lines in the center) in which diamond particles are composited in Cu or a Cu alloy matrix is inserted into a laminated plate composed of Cu/Cu—Mo/Cu/Cu—Mo/Cu. At this time, as illustrated in FIG. 4, it is preferable that in a portion in which a semiconductor chip is mounted, only a Cu layer is present on upper and lower surfaces of a Cu-diamond composite material, and other portions except for the composite material is composed of Cu/Cu—Mo/Cu/Cu—Mo/Cu. In this structure, as illustrated in FIG. 5, a portion to which ceramics are bonded is composed of a laminate structure of Cu/Cu—Mo/Cu/Cu—Mo/Cu, so that it is easy to match a thermal expansion coefficient with the ceramics, and a portion in contact with the semiconductor chip is a structure capable of increasing thermal conductivity.

In addition, the composite material according to the third embodiment has little difference in thermal expansion coefficient despite the change in heating temperature (e.g., while heating from 0° C. to 800° C.), and thus, has an advantage of being able to correspond to various process temperatures compared to a material with a significant difference in thermal expansion coefficient according to temperatures.

Fourth Embodiment

A composite material according to the fourth embodiment of the invention is in which the composite material according to the first embodiment or the second embodiment has a plate shape, the metal matrix is composed of Cu or a Cu alloy, and on each of upper and lower surfaces of the plate-shaped composite material, a first layer composed of an alloy including copper (Cu) and molybdenum (Mo) is formed, and on the outer surface of each of the first layers, a second layer composed of copper (Cu) or a copper (Cu) alloy is formed.

In the composite material according to the fourth embodiment having a laminate structure as illustrated in FIG. 6, the first layer is composed of an alloy including copper (Cu) and molybdenum (Mo), and it is preferable that the alloy includes copper (Cu) in an amount of 5 to 40 wt % and molybdenum (Mo) in an amount of 60 to 95 wt % because if the content of copper (Cu) is less than 5 wt %, it is difficult to maintain good bonding force with a copper (Cu) layer, and the thermal conductivity in the thickness direction is reduced, and if greater than 40 wt %, it is difficult to maintain the thermal expansion coefficient in the plane direction low.

The second layer may be composed of a copper (Cu) alloy including pure copper (Cu) in an amount of 99.9 wt % or greater and various alloying elements in an amount of 0.1 wt % or greater, and when considering heat dissipation properties, the copper (Cu) alloy may include copper (Cu) in an amount of 80 wt % or greater 90 wt % or greater, and more preferably 95 wt % or greater.

When the thickness of the first layer is less than 10 μm, it is difficult to maintain the thermal expansion coefficient in the plane direction in the range of 7 to 12×10-6/K, and when greater than 60 μm, it is difficult to maintain the thermal conductivity in the thickness direction in the range of 300 W/mK or greater, so that it is preferable to maintain the thickness in the range of 10 to 60 μm. When the thickness of each of the second layer and the fourth layer is less than 10 μm, it is difficult to maintain the thermal expansion coefficient in the plane direction in the range of 7 to 12×10-6/K, and when greater than 60 μm, it is difficult to maintain the thermal conductivity in the thickness direction in the range of 300 W/mK or greater, so that it is preferable to maintain the thickness in the range of 10 to 60 μm.

When the thickness of the second layer is maintained in the range of 10 to 1000 μm, the thermal expansion coefficient in the plane direction of a heat dissipation plate may be maintained in the range of 7 to $12 \times 10^{-6}$/K, and the thermal conductivity in the thickness direction thereof may be implemented to be 300 W/mK or greater, so that it is preferable to maintain the above range.

As in the case of the third embodiment, the composite material according to the fourth embodiment has little difference in thermal expansion coefficient despite the change in heating temperature (e.g., while heating from 0° C. to 800° C.), and thus, is preferable in terms of being able to correspond to various process temperatures compared to a material with a significant difference in thermal expansion coefficient according to temperatures.

Fifth Embodiment

A composite material according to the fifth embodiment of the invention is in which the composite material according to any one of the first embodiment to the fourth embodiment has a plate shape, and has a shape in which the thermally conductive particles are regularly arranged at predetermined intervals on a plane of the plate shape.

As shown in FIG. 7, if it is possible to form a pattern (gray particles in FIG. 7 are diamond particles) of being arranged at predetermined intervals horizontally and vertically with respect to a plane of a plate, it is possible to selectively control a thermal expansion coefficient and control thermal conductivity in a plate composed of a composite material. In addition, when thermally conductive particles are regularly arranged, the usage amount of expensive thermally conductive particles such as diamond may be reduced as compared to when randomly arranged, and more than equal properties may be implemented as compared to when randomly arranged.

In the case of a structure in which thermally conductive particles are regularly arranged, it is preferable that sizes of the thermally conductive particles are uniform. For example, the difference in particle size may be within ±20% based on a center value, and preferably within ±10%.

Sixth Embodiment

A composite material according to the sixth embodiment of the invention is in which, in the composite material according to any one of the first embodiment to the fifth embodiment, the thermally conductive particles are diamond particles, and a metal carbide layer is formed at the interface between the metal matrix and the diamond particles.

A metal and diamond particles have low wetting, and thus, may cause defects such as pores or cracks at the interface, and since the pores and cracks may significantly degrade thermal conductivity, it is preferable to suppress the pores and cracks as much as possible. To this end, it is preferable to form a metal carbide layer which may improve wetting between the metal matrix and the diamond particles. A metal carbide layer may be formed, for example, by coating a metal on the surface of diamond and then carbonizing a portion of the metal through heat applied during a heat treatment or complexation process, but is not necessarily limited thereto, and any known method for forming a metal carbide layer may be applied.

The metal carbide layer may be one or more carbides selected from Ti, Zr, and Hf, which are Group 4 metals on the periodic table, more preferably TiC, and at this time, a portion of Ti may remain to form an interface structure in the form of a metal matrix/Ti/TiC/diamond.

Seventh Embodiment

A composite material according to the seventh embodiment of the invention is in which the composite material according to any one of the first embodiment to the sixth embodiment has a plate shape, the metal matrix is composed of copper or a copper alloy and the thermally conductive particles are diamond particles, the thermal conductivity in the thickness direction of the plate shape is 450 W/mK or greater, and the thermal expansion coefficient in the plane direction of the plate shaped surface is $3 \times 10^{-6}$/K to $13 \times 10^{-6}$/K at 25° C. to 200° C.

Eighth Embodiment

A composite material according to the eighth embodiment of the invention is in which the composite material according to any one of the first embodiment to the sixth embodiment has a plate shape, the metal matrix is composed of silver or a silver alloy and the thermally conductive particles are diamond particles, the thermal conductivity in the thickness direction of the plate shape is 600 W/mK or greater, and the thermal expansion coefficient in the plane direction of the plate shaped surface is $3 \times 10^{-6}$/K to $13 \times 10^{-6}$/K at 25° C. to 200° C.

Ninth Embodiment

A composite material according to the ninth embodiment of the invention is in which the composite material according to any one of the first embodiment to the sixth embodiment has a plate shape, the metal matrix is composed of copper or a copper alloy and the thermally conductive particles are SiC particles, the thermal conductivity in the thickness direction of the plate shape is 300 W/mK or greater, and the thermal expansion coefficient in the plane direction of the plate shaped surface is $3\times10^{-6}$/K to $13\times10^{-6}$/K at 25° C. to 200° C.

Tenth Embodiment

A composite material according to the tenth embodiment of the invention is in which the composite material according to any one of the first embodiment to the sixth embodiment has a plate shape, the metal matrix is composed of magnesium or a magnesium alloy and the thermally conductive particles are diamond particles and/or SiC particles, the thermal conductivity in the thickness direction of the plate shape is 200 W/mK or greater, and the thermal expansion coefficient in the plane direction of the plate shaped surface is $5\times10^{-6}$/K to $15\times10^{-6}$/K at 25° C. to 200° C.

Eleventh Embodiment

A composite material according to the eleventh embodiment of the invention is in which the composite material according to any one of the first embodiment to the sixth embodiment has a plate shape, the metal matrix is composed of aluminum or an aluminum alloy and the thermally conductive particles are diamond particles and/or SiC particles, the thermal conductivity in the thickness direction of the plate shape is 150 W/mK or greater, and the thermal expansion coefficient in the plane direction of the plate shaped surface is $5\times10^{-6}$/K to $15\times10^{-6}$/K at 25° C. to 200° C.

The composite materials according to the first to eleventh embodiments may be manufactured by the following various methods.

For example, a metal-thermally conductive composite particle is manufactured by forming a metal coating layer having a predetermined thickness on the surface of the thermally conductive particle using a known coating method such as electroless plating, which is an electrochemical method, or sputtering or ball milling, which is a physical method. Thereafter, the manufactured composite particle is press-molded to have a thickness of 1.1 to 1.3 times the maximum size of the particle to form a single layer such that two or more particles are not laminated in a thickness direction, and then a composite sheet in which the thermally conductive particles are arranged in a single layer is manufactured using the SPS sintering method. The composite sheet in which the thermally conductive particles are arranged in a single layer as described above are laminated and sintered to form a composite structure in which thermally conductive particles are arranged in the thickness direction as well.

In addition, as another method, in a metal sheet having a predetermined pattern or hole, thermal conductive particles are uniformly dispersed in a predetermined position using the pattern or hole of the sheet by means of sand blasting, press, static electricity, vacuum, and the like, and then a composite sheet composed of a single layer of the thermally conductive particles is manufactured by bonding the metal sheet and the thermally conductive particles through a sintering method. At this time, the thickness of the metal sheet is preferably 1.1 to 1.3 times the maximum size of the thermally conductive particles. The composite sheet manufactured as described above are laminated to form a structure in which particles are arranged in the thickness direction as well.

Example 1

In Example 1, a composite material in which diamond particles were uniformly dispersed and composited in a copper (Cu) matrix was manufactured.

First, diamond powder having particle sizes of 50 μm, 150 μm, 200 μm, 700 μm, and 800 μm was prepared. Diamond particles having a uniform size in which the size of the particles constituting the powder was within ±20% (more preferably within ±10%) of the representative value (average) were used.

Titanium (Ti) was coated on the surface of the diamond particles using a physical vapor deposition (PVD) method, and at this time, at the interface between the diamond and the titanium (Ti), carbon (C) constituting the diamond and a portion of the titanium (Ti) reacted to form titanium carbide (TiC). The titanium (Ti) layer is a kind of bonding layer to improve the wetting between diamond, which has poor wetting, and copper (Cu) to have good bonding force when composited.

Next, by using an electroless plating method, a copper (Cu) coating layer was formed on the surface of the diamond particles coated with titanium (Ti). At this time, the thickness of the copper (Cu) coating layer was about 50 to 100 μm.

Thereafter, the diamond particles were press-molded to have a thickness of 1.1 to 1.3 times the maximum size of the diamond particles within a pressure range in which the diamond particles were not broken. At this time, the molding pressure of the press was set to 200 MPa.

Through the press molding, a molded body in which the diamond particles formed a single layer was obtained. A Cu-diamond composite sheet was manufactured by sintering the obtained molded body at 1,000° C. using a spark plasma sintering (SPARK) method. The manufactured composite sheet as described above was laminated in layers of various numbers, such as two layers, three layers, four layers, five layers, and the like, and then sintered again and bonded to manufacture a composite sheet (heat dissipation substrate) having a structure which has a predetermined thickness and includes diamond particles at a volume ratio of about 15% to 80%, and at the same time, in which the distance between the center of any one diamond particle and the center of a diamond particle most adjacent to the any one diamond particle is 200 μm or greater, and copper (Cu), which is a metal matrix, is necessarily disposed between the diamond particles.

Meanwhile, in Example 1 of the invention, an example in which a composite sheet is used as a heat dissipation substrate is presented, but a copper (Cu) sheet or a copper-molybdenum (Cu—Mo) alloy sheet may be laminated between the composite sheets to be manufactured as a heat dissipation substrate having various laminate structures of three layers, five layers, seven layers, and the like.

Among substrates manufactured according to Example 1, in the case of a heat dissipation substrate having a diamond volume ratio of about 35% and a thickness of about 1,600 μm, the thermal conductivity in a XY direction (plane direction of substrate) and in a Z direction (thickness direction) was about 600 W/mK, and the thermal expansion coefficient in the XY direction (plane direction of substrate) at 200° C. showed a value of $10\times10^{-6}$/K.

FIG. 8 shows cross-sectional structures of three examples (Examples 1-1 to 1-3) which belong to the range of a microstructure claimed in the invention, and the cross-sectional structure of one example (Comparative Example 1) which do not belong to the range of the microstructure claimed in the invention, wherein examples were manufactured by the method of Example 1. In the cross-sectional structures of FIG. 8, the results of measuring a distance D1 between the center of any one diamond particle and the center of a diamond particle most adjacent to the any one diamond particle are the same as the values shown in FIG. 8. That is, in the case of Examples 1-1 to 1-3 of the invention, diamond particles were included in a significant amount at a volume ratio of 17.5% to 40%, and at the same time, the distance D1 between the center of any one diamond particle and the center of a diamond particle most adjacent to the any one diamond particle was maintained to be 200 μm or greater, whereas in the case of Comparative Example 1, the volume ratio of the diamond particles was 40%, but the distance D1 between the center of any one diamond particle and the center of a diamond particle most adjacent to the any one diamond particle was about 150 μm, which was shorter than those of the embodiments of the invention.

FIG. 9 shows the comparison of thermal conductivity before heating and thermal conductivity after the heating after applying heat of heating the composite materials manufactured according to Examples 1-1 to 1-3 and Comparative Example 1 to 850° C. As shown in FIG. 9, after repeatedly applying a thermal cycle two to three times, in the case of Example 1-3, there was slight degradation in thermal conductivity (TC), but in the case of Examples 1-1 and 1-2, there was substantially no difference in thermal conductivity (TC).

On the other hand, in the case of Comparative Example 1, the thermal conductivity was maintained as high as 600 W/mK when a thermal cycle was applied one time since diamond particles were included in a significant amount at a volume ratio of 40%, but after the thermal cycle was repeated two and three times, the thermal conductivity was deteriorated to a level of about 300 W/mK, showing that excellent heat dissipation properties required for a Cu-diamond composite were not maintained as the thermal cycle was repeatedly applied.

FIG. 10 is images of composite materials manufactured according to Example 1-4 and Comparative Example 2 observed on a planar cross-section.

Example 1-4 and Comparative Example 2 were manufactured with the same volume ratio of diamond particles of 70%. As shown in FIG. 10, Example 1-4 shows a state in which particles are uniformly dispersed while not contacting each other on a plane, but Comparative Example 2 has a structure in which particles contacting each other are present, thereby having poor uniformity compared to that of Example 1-4.

FIG. 11 shows the results of measuring the distribution of distances between the centers of diamond particles observed on planar cross-sections of the composite materials manufactured according to Examples 1~4 and Comparative Example 2.

As quantitatively confirmed in FIG. 11, in the case of Example 1-4, the distance between the center of any one diamond particle and the center of a diamond particle most adjacent to the any one diamond particle is present within ±10% based on a center value of 900 μm, whereas in the case of Comparative Example 2, the distance between the center of any one diamond particle and the center of a diamond particle most adjacent to the any one diamond particle shows a wide distribution.

FIG. 12 shows the comparison of thermal conductivity before heating and thermal conductivity after the heating after applying heat of heating the composite materials manufactured according to Examples to 1-3 and Comparative Example 1 to 850° C. As shown in FIG. 12, even after repeatedly applying a thermal cycle two to three times, in the case of Example 1-4, there was almost no degradation in the thermal conductivity (TC), but in the case of Example 2, there was a significant difference in thermal conductivity. From the above, it can be seen that the composite material composed of the structure according to Example 1-4 of the invention is advantageous in preventing the degradation in thermal conductivity properties even when a plurality of thermal cycles are applied.

Example 2

In Example 2, a plate-shaped composite material in which three types of diamond particles having different sizes were composited with a copper (Cu) matrix was manufactured.

For the three types of diamond particles, 500 μm particles, 200 μm particles, and 100 μm particles were respectively used, and on a cross-sectional structure in a thickness direction of the composite material plate, 500 μm particles were arranged approximately horizontally along the center, 200 μm particles were arranged approximately horizontally in a region slightly off the center, and 100 μm particles were arranged approximately horizontally near the surface.

In the plate-shaped composite material according to Example 2, a Cu-diamond composite sheet composed of a single layer of 500 μm particles, a Cu-diamond composite sheet composed of a single layer of 200 μm particles, and a Cu-diamond composite sheet composed of a single layer of 100 μm particles were first manufactured using the same method as in Example 1.

Next, the Cu-diamond composite sheet composed of a single layer of 500 μm particles was disposed in the center, and on both sides of the Cu-diamond composite sheet, two of the Cu-diamond composite sheets composed of a single layer of 200 μm particles were laminated and disposed, and on the outside of the Cu-diamond composite sheet composed of a single layer of 200 μm particles, the Cu-diamond composite sheet composed of a single layer of 100 μm particles was laminated and disposed.

Lastly, the laminate was sintered at 1,000° C. using a spark plasm sintering method to manufacture a Cu-diamond composite sheet according to Example 2.

Among substrates manufactured according to Example 2, in the case of a heat dissipation substrate having a diamond volume ratio of about 55% and a thickness of about 1,600 μm, the thermal conductivity in the XY direction (plane direction of substrate) and in the Z direction (thickness direction) was about 750 W/mK, and the thermal expansion coefficient in the XY direction (plane direction of substrate) at 200° C. showed a value of $8 \times 10^{-6}$/K.

FIG. 13 is a cross-sectional photograph in a thickness direction of the composite material plate manufactured by the method according to Example 2. As confirmed in FIG. 13, the composite material plate manufactured according to Example 2 has an inclined structure with a difference in diamond particle size in which on a cross-section in a thickness direction, the largest particle is disposed in the center and the size of particles decreases toward the surface.

FIG. 14 is a graph showing the difference in thermal conductivity in the thickness direction according to a diamond volume ratio between regularly arranging diamond particles of the same size and arranging diamond particles in the inclined structure according to Example 2.

As confirmed in FIG. 14, it can be seen that even if the volume ratio of the diamond particles is the same, a large particle size shows a significant difference in terms of thermal conductivity. Therefore, it is preferable that at least 50% of the diamond particles used as thermally conductive particles have a size of 300 μm or greater, more preferably 400 μm or greater, and most preferably 500 μm or greater.

Particularly, it is more preferable that large particles of 300 μm or greater and small particles of 200 μm or less form an inclined structure as in Example 2 in terms of increasing the volume ratio of the diamond, thereby improving thermal conductivity. In addition, as in the case of Example 1, the composite material according to Example 2 also had almost no degradation in the thermal conductivity (TC) even after repeatedly applying a thermal cycle two to three times.

FIG. 15 shows the comparison of bending states after heating of a composite material plate in which diamond particles are symmetrically arranged according to Example 2 of the invention and heating a composite material plate in which diamond particles are randomly dispersed. As confirmed in FIG. 15, when diamond particles are arranged symmetrically (or regularly), there was almost no bending after the heating, but in the case of the composite material plate in which diamond particles are randomly dispersed, there were many cases in which the plate was bent.

Example 3

In Example 3, a composite material plate having a structure in which a copper-diamond composite material was buried inside a Cu/Cu—Mo/Cu/Cu—Mo/Cu laminated plate was manufactured.

First, a copper (Cu) plate and a copper-molybdenum (Cu—Mo) plate were laminated in the order of Cu/Cu—Mo/Cu/Cu—Mo/Cu, and then sintered at 1,000° C. using a spark plasma sintering method to manufacture a Cu/Cu—Mo/Cu/Cu—Mo/Cu laminated plate having a thickness of 900 μm. The thickness of each layer constituting the laminated plate was 200 μm for the outer Cu layers, 200 μm for the Cu—Mo layers, and 100 μm for the center Cu layer.

A central portion of the laminated plate was removed through a known processing method such as electric discharge wire processing, milling, water jet, and laser processing to form a window portion in the center.

A Cu-diamond composite material plate was manufactured through the method of Example 1, and then cut and processed into a coin shape to have a tolerance enough to be inserted into the window portion.

The coin-shaped Cu-diamond composite material plate was inserted into the window portion of the laminated plate, and then a Cu plate having a thickness of 200 μm was positioned on both sides for the outer Cu layers, and sintered at 1,000° C. using a spark plasma sintering method to manufacture the composite material plate according to Example 3.

In the case of a Cu-diamond coin structure having a diamond volume ratio of 35% and manufactured according to Example 3, the thermal conductivity in the Z direction (thickness direction) and in the XY direction (plane direction) was as high as about 600 W/mk. In addition, as confirmed in FIG. 16, the thermal expansion coefficient showed a value of $8.6 \times 10^{-6}$/K at 200° C., and the thermal expansion coefficient showed a value of $7.6 \times 10^{-6}$/K at 800° C., which is very similar to that of ceramics, which is $7.7 \times 10^{-6}$/K. Such properties allow for the implementation of stable properties in which there is no bending and adhesion properties are excellent due to similar thermal expansion properties when bonding with ceramics at 800° C. when manufacturing a semiconductor package.

Since a central portion in which a semiconductor chip is mounted is to be in contact with the Cu-diamond composite material having significantly excellent thermal conductivity, and a peripheral portion is to be in contact with the Cu—Mo/Cu/Cu—Mo/Cu laminate structure having little difference in thermal expansion coefficient with a ceramic material, a composite plate of the structure has advantages in that the usage amount of diamond, which is an expensive material, may be reduced, and also, the difference in thermal expansion coefficient with the ceramic material may be significantly reduced, so that heat generated in the semiconductor chip may be quickly removed while preventing defects during bonding.

In addition, as shown in FIG. 17, a laminated plate of the above structure has an advantage of being applied to various temperature ranges since there is little difference in thermal expansion coefficient in the range of 0° C. to 800° C., compared to a Cu—Mo/Cu/Cu—Mo/Cu laminated plate which has a significant difference in thermal expansion coefficient according to heating temperatures.

Example 4

The Cu/Ti/TiC/diamond composite particles manufactured according to Example 1 and magnesium (Mg) particles were mixed using a stirrer. At this time, the diamond particle size of the Cu/Ti/TiC/diamond composite particles was 500 μm, and the average size of the magnesium (Mg) particles was 100 μm. Instead of the Cu/Ti/TiC/diamond composite particles, Ti/TiC/diamond composite particles having the same particle size may be used.

The mixed particles were press-molded to have a thickness of 1.1 to 1.3 times the maximum size of the diamond particles in the same manner as in Example 1 to manufacture a molded body in which the diamond particles were arranged in a single layer. Lastly, the molded body was sintered under the same conditions as in Example 1 to manufacture a Mg—Cu-diamond composite sheet.

The Mg—Cu-diamond composite sheet may be laminated in layers of various numbers, such as two layers, three layers, four layers, and the like to manufacture a heat dissipation substrate having a predetermined thickness. In addition, by laminating with a magnesium sheet, a heat dissipation substrate in various forms, such as three layers, five layer, and seven layers, may be manufactured.

According to Example 4, by laminating and arranging two composite sheets in which a diamond single layer is arranged and a magnesium sheet between the composite sheets and on the outside of the composite sheets, and then sintering SPC, a heat dissipation substrate having a diamond volume ratio of 35%, a thickness of 1,500 μm, and the structure shown in FIG. 18 was manufactured. In the case of the heat dissipation substrate according to Example 4, the thermal conductivity in the Z direction (thickness direction) and in the XY direction (plane direction) was about 500 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 4 to 500° C., the thermal conductivity degradation rate was 5% or less even after repeatedly applying the thermal cycle three times.

Example 5

The Cu/Ti/TiC/diamond composite particles manufactured according to Example 1 and silver (Ag) particles were mixed using a stirrer. At this time, the diamond particle size of the Cu/Ti/TiC/diamond composite particles was 200 μm, and the average size of the silver (Ag) particles was 100 μm. Instead of the Cu/Ti/TiC/diamond composite particles, Ti/TiC/diamond composite particles having the same particle size may be used.

The mixed particles were press-molded to have a thickness of 1.1 to 1.3 times the maximum size of the diamond particles in the same manner as in Example 1 to manufacture a molded body in which the diamond particles were arranged in a single layer. Lastly, the molded body was sintered under the same conditions as in Example 1 to manufacture a Ag—Cu-diamond composite sheet.

In the same manner as in Example 4, the Ag—Cu-diamond composite sheet may be laminated in layers of various numbers, such as two layers, three layers, four layers, and the like to manufacture a heat dissipation substrate having a predetermined thickness. In addition, by laminating with a silver (Ag) sheet, a heat dissipation substrate in various forms, such as three layers, five layer, and seven layers, may be manufactured.

According to Example 5, by laminating and arranging six composite sheets in which a diamond single layer is arranged and then sintering SPC, a heat dissipation substrate having a diamond volume ratio of 35%, a thickness of 1,500 μm, and the structure shown in FIG. 18 was manufactured. In the case of the heat dissipation substrate according to Example 5, the thermal conductivity in the Z direction (thickness direction) and in the XY direction (plane direction) was about 600 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 5 to 900° C., the thermal conductivity degradation rate was 5% or less even after repeatedly applying the thermal cycle three times.

Example 6

The Cu/Ti/TiC/diamond composite particles manufactured according to Example 1 and aluminum (Al) particles were mixed using a stirrer. At this time, the diamond particle size of the Cu/Ti/TiC/diamond composite particles was 200 μm, and the average size of the aluminum (Al) particles was 100 μm. Instead of the Cu/Ti/TiC/diamond composite particles, Ti/TiC/diamond composite particles having the same particle size may be used.

The mixed particles were press-molded to have a thickness of 1.1 to 1.3 times the maximum size of the diamond particles in the same manner as in Example 1 to manufacture a molded body in which the diamond particles were arranged in a single layer. Lastly, the molded body was sintered under the same conditions as in Example 1 to manufacture a Al—Cu-diamond composite sheet.

In the same manner as in Example 4, the Al—Cu-diamond composite sheet may be laminated in layers of various numbers, such as two layers, three layers, four layers, and the like to manufacture a heat dissipation substrate having a predetermined thickness. In addition, by laminating with an aluminum (Al) sheet, a heat dissipation substrate in various forms, such as three layers, five layer, and seven layers, may be manufactured.

According to Example 6, by laminating and arranging six composite sheets in which a diamond single layer is arranged and then sintering SPC, a heat dissipation substrate having a diamond volume ratio of 35%, a thickness of 1,600 μm, and the structure shown in FIG. 18 was manufactured. In the case of the heat dissipation substrate according to Example 6, the thermal conductivity in the Z direction (thickness direction) and in the XY direction (plane direction) was about 500 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 6 to 500° C., the thermal conductivity degradation rate was 5% or less even after repeatedly applying the thermal cycle three times.

Example 7

In Example 7, a composite material in which SiC particles were uniformly dispersed and composited in a copper (Cu) matrix was manufactured.

First, SiC powder having a particle size of 500 μm was prepared. SiC particles having a uniform size in which the size of the particles constituting the powder was within ±20% (preferably within ±10%) of the representative value were used.

Using a ball-mill method, copper particles and the SiC particles were strongly mixed such that the copper particles are attached to the surface of the SiC particles.

Next, the SiC particles were press-molded to have a thickness of 1.1 to 1.3 times the maximum size of the SiC particles within a pressure range in which the SiC particles were not broken. The molding pressure was set to 100 MPa.

Through the press molding, a molded body in which the SiC particles were arranged in a single layer was obtained. A Cu-diamond composite sheet was manufactured by sintering the obtained molded body at 1,000° C. using a spark plasma sintering (SPARK) method. The manufactured composite sheet as described above was laminated in layers of various numbers, such as two layers, three layers, four layers, five layers, and the like, and then sintered again and bonded to manufacture a composite sheet (heat dissipation substrate) having a structure which has a predetermined thickness and includes SiC particles at a volume ratio of about 15% to 80%, and at the same time, in which the distance between the center of any one SiC particle and the center of a SiC particle most adjacent to the any one SiC particle is 200 μm or greater.

In addition, a composite sheet in which SiC particles are arranged in a single layer and a copper (Cu) sheet or a copper-molybdenum (Cu—Mo) alloy sheet may be laminated to be manufactured as a heat dissipation substrate having various laminate structures of three layers, five layers, seven layers, and the like.

According to Example 7, by laminating and arranging four composite sheets in which a SiC single layer is arranged and then sintering SPC, a heat dissipation substrate having a SiC volume ratio of 45%, a thickness of 2,500 μm, and the structure shown in FIG. 18 was manufactured. In the case of the heat dissipation substrate according to Example 7, the thermal conductivity in the Z direction (thickness direction) and in the XY direction (plane direction) was about 350 W/mK, and the thermal expansion coefficient in the XY direction (plane direction) at 200° C. showed a value of $12 \times 10^{-6}$/K.

When the thermal conductivity before heating and the thermal conductivity after the heating were compared after applying a thermal cycle of heating the composite material manufactured according to Example 7 to 850° C., the thermal conductivity degradation rate was 5% or less even after repeatedly applying the thermal cycle three times.

Example 8

In the same manner as in Example 7, a composite sheet of SiC particles and magnesium (Mg) particles was manufactured. At this time, the size and volume ratio of the SiC particles and the size and volume ratio of the magnesium (Mg) particles used were the same. However, the press molding pressure was set to 100 MPa and the SPC sintering temperature was set to 550° C.

According to Example 8, by laminating and arranging four composite sheets in which a SiC single layer is arranged and then sintering SPC, a heat dissipation substrate having a SiC volume ratio of 45%, a thickness of 2,500 μm, and the structure shown in FIG. 18 was manufactured. In the case of the heat dissipation substrate according to Example 8, the thermal conductivity in the Z direction (thickness direction) and in the XY direction (plane direction) was about 250 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 8 to 500° C., the thermal conductivity degradation rate was 5% or less even after repeatedly applying the thermal cycle three times.

Example 9

In the same manner as in Example 7, a composite sheet of SiC particles and silver (Ag) particles was manufactured. At this time, the size and volume ratio of the SiC particles and the size and volume ratio of the silver (Ag) particles used were the same. However, the press molding pressure was set to 100 MPa and the SPC sintering temperature was set to 900° C.

According to Example 9, by laminating and arranging four composite sheets in which a SiC single layer is arranged and then sintering SPC, a heat dissipation substrate having a SiC volume ratio of 45%, a thickness of 2,500 μm, and the structure shown in FIG. 18 was manufactured. In the case of the heat dissipation substrate according to Example 9, the thermal conductivity in the Z direction (thickness direction) and in the XY direction (plane direction) was about 350 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 9 to 850° C., the thermal conductivity degradation rate was 5% or less even after repeatedly applying the thermal cycle three times.

Example 10

In the same manner as in Example 7, a composite sheet of SiC particles and aluminum (Al) particles was manufactured. At this time, the size and volume ratio of the SiC particles and the size and volume ratio of the aluminum (Al) particles used were the same. However, the press molding pressure was set to 100 MPa and the SPC sintering temperature was set to 550° C.

According to Example 10, by laminating and arranging four composite sheets in which a SiC single layer is arranged and then sintering SPC, a heat dissipation substrate having a SiC volume ratio of 45%, a thickness of 2,500 μm, and the structure shown in FIG. 18 was manufactured. In the case of the heat dissipation substrate according to Example 10, the thermal conductivity in the Z direction (thickness direction) and in the XY direction (plane direction) was about 200 W/mK, and the thermal expansion coefficient in the XY direction (plane direction) at 200° C. showed a value of $13 \times 10^{-6}$/K.

When the thermal conductivity before heating and the thermal conductivity after the heating were compared after applying a thermal cycle of heating the composite material manufactured according to Example 10 to 500° C., the thermal conductivity degradation rate was 5% or less even after repeatedly applying the thermal cycle three times.

What is claimed is:

1. A composite material comprising a metal matrix and a structure in which thermally conductive particles are dispersed inside the metal matrix, wherein:
   the metal matrix is composed of Cu, Ag, Al, Mg, or an alloy thereof;
   the thermally conductive particles include diamond or SiC;
   the thermally conductive particles are included at a volume ratio of 15% to 80%;
   in a microstructure of the composite material, the distance between the center of any one thermally conductive particle and the center of a thermally conductive particle most adjacent to the any one thermally conductive particle is 200 μm or greater;
   the any one thermally conductive particle and the thermally conductive particle most adjacent thereto are not in contact with each other but have a metal matrix therebetween; and
   the thermal conductivity measured after heating the composite material to a temperature in Celsius lower by 20 to 30% than the melting point of the metal matrix has a thermal conductivity degradation rate of 5% or less based on the thermal conductivity thereof before the heating.

2. A composite material comprising a metal matrix and a structure in which thermally conductive particles are dispersed inside the metal matrix, wherein:
   the metal matrix is composed of Cu, Ag, Al, Mg, or an alloy thereof;
   the thermally conductive particles include diamond or SiC;
   the thermally conductive particles are included at a volume ratio of 15% to 80%; and
   in a microstructure of the composite material, the thermally conductive particles include a large particle and a small particle with a particle size difference of 150 μm or greater, wherein:
   when the large particle is a first particle, and the small particle is a second particle, the distance between the center of the first particle and the center of a first particle most adjacent to the first particle or the second particle is 200 μm or greater;
   the first particle and the first particle most adjacent thereto or the second particle are not in contact with each other but have a metal matrix therebetween; and
   the thermal conductivity measured after heating the composite material to a temperature in Celsius lower by 20 to 30% than the melting point of the metal matrix has a thermal conductivity degradation rate of 5% or less based on the thermal conductivity thereof before the heating.

3. The composite material of claim 2, wherein the composite material has a plate shape, and the first particle is disposed at a central region of a cross section in a thickness direction of the plate, and the second particle is disposed close to a surface region of the plate, such that the size of the thermally conductive particle decreases from the central region toward the surface region.

4. The composite material of claim 3, wherein the first particle is arranged at predetermined intervals along a direction perpendicular to the thickness direction of the plate.

5. The composite material of claim 1, wherein:
the composite material has a plate shape;
the particle size of the thermally conductive particle is 300 μm or greater; and
when viewed from a top surface plane of the plate into an interior of the plate, the distance between the center of any one thermally conductive particle and the center of a thermally conductive particle most adjacent to the any one thermally conductive particle has a value within ±20% of the median value of distances between the center of all thermally conductive particles and the center of thermally conductive particles most adjacent thereto viewed from the top surface plane of the plate into the interior of the plate.

6. The composite material of claim 1, wherein the metal matrix is composed of Cu or a Cu alloy, and the composite material is buried inside a laminated plate, wherein the laminated plate includes a first layer composed of copper (Cu) or a copper (Cu) alloy, a second layer formed on the first layer and composed of an alloy including copper (Cu) and molybdenum (Mo), a third layer formed on the second layer and composed of copper (Cu) or a copper (Cu) alloy, a fourth layer formed on the third layer and composed of an alloy including copper (Cu) and molybdenum (Mo), and a fifth layer formed on the fourth layer and composed of copper (Cu) or copper (Cu) alloy.

7. The composite material of claim 1, wherein:
the composite material has a plate shape;
the metal matrix is composed of Cu or a Cu alloy; and
on each of upper and lower surfaces of the plate-shaped composite material, a first layer composed of an alloy including copper (Cu) and molybdenum (Mo) is formed, and on the outer surface of each of the first layers, a second layer composed of copper (Cu) or a copper (Cu) alloy is formed.

8. The composite material of claim 1, wherein the composite material has a plate shape, wherein the thermally conductive particles are substantially arranged regularly at predetermined intervals along a plane direction of the plate.

9. The composite material claim 1, wherein the thermally conductive particles are diamond particles, and a metal carbide layer is formed at the interface between the metal matrix and the diamond particles.

10. The composite material of claim 9, wherein the metal carbide is TiC.

11. The composite material of claim 1, wherein the thermally conductive particles are included at a volume ratio of 20% to 80%, and the distance between the center of any one thermally conductive particle and the center of a thermally conductive particle most adjacent to the any one thermally conductive particle is 400 μm or greater.

12. The composite material of claim 2, wherein the thermally conductive particles are included at a volume ratio of 20% to 80%, and the distance between the center of the first particle and the center of a first particle most adjacent to the first particle or the second particle is 250 μm or greater.

13. The composite material of claim 1, wherein the thermal conductivity measured after repeating 3 times of heating the composite material to a temperature lower by 20 to 30% than the melting point of the metal matrix and cooling the composite material to room temperature has a thermal conductivity degradation rate of 5% or less based on the thermal conductivity thereof before the initial heating.

14. The composite material of claim 1, wherein:
the composite material has a plate shape;
the metal matrix is composed of copper or a copper alloy and the thermally conductive particles are diamond particles;
the thermal conductivity in a thickness direction of the plate shape is 400 W/mK or greater; and
the thermal expansion coefficient in a plane direction of the plate shape is $3 \times 10^{-6}$/K to $13 \times 10^{-6}$/K at 25° C. to 200° C.

15. The composite material of claim 1, wherein:
the composite material has a plate shape;
the metal matrix is composed of silver or a silver alloy and the thermally conductive particles are diamond particles;
the thermal conductivity in the thickness direction of the plate shape is 500 W/mK or greater; and
the thermal expansion coefficient in the plane direction of the plate shape is $3 \times 10^{-6}$/K to $13 \times 10^{-6}$/K at 25° C. to 200° C.

16. The composite material of claim 1, wherein:
the composite material has a plate shape;
the metal matrix is composed of copper or a copper alloy and the thermally conductive particles are SiC particles;
the thermal conductivity in the thickness direction of the plate shape is 400 W/mK or greater; and
the thermal expansion coefficient in the plane direction of the plate shape is $3 \times 10^{-6}$/K to $13 \times 10^{-6}$/K at 25° C. to 200° C.

17. The composite material of claim 1, wherein:
the composite material has a plate shape;
the metal matrix is composed of magnesium or a magnesium alloy and the thermally conductive particles are diamond particles and/or SiC particles;
the thermal conductivity in the thickness direction of the plate shape is 150 W/mK or greater; and
the thermal expansion coefficient in the plane direction of the plate shape is $5 \times 10^{-6}$/K to $15 \times 10^{-6}$/K at 25° C. to 200° C.

18. The composite material of claim 1, wherein:
the composite material has a plate shape;
the metal matrix is composed of aluminum or an aluminum alloy and the thermally conductive particles are diamond particles and/or SiC particles;
the thermal conductivity in the thickness direction of the plate shape is 400 W/mK or greater; and
the thermal expansion coefficient in the plane direction of the plate shape is $5 \times 10^{-6}$/K to $15 \times 10^{-6}$/K at 25° C. to 200° C.

19. A dissipation part comprising the composite material according to claim 1.

* * * * *